United States Patent
McCleskey et al.

(10) Patent No.: US 7,365,118 B2
(45) Date of Patent: Apr. 29, 2008

(54) POLYMER-ASSISTED DEPOSITION OF FILMS

(75) Inventors: Thomas M. McCleskey, Los Alamos, NM (US); Anthony K. Burrell, Los Alamos, NM (US); Quanxi Jia, Los Alamos, NM (US); Yuan Lin, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 743 days.

(21) Appl. No.: 10/616,479

(22) Filed: Jul. 8, 2003

(65) Prior Publication Data

US 2005/0008777 A1     Jan. 13, 2005

(51) Int. Cl.
*C08K 3/10* (2006.01)
*C08F 6/00* (2006.01)
*C09C 1/00* (2006.01)

(52) U.S. Cl. ............... 524/401; 106/436; 528/490; 528/502 A

(58) Field of Classification Search .......... 106/436; 528/490, 502 A; 524/401
See application file for complete search history.

(56) References Cited

U.S. PATENT DOCUMENTS

| | | | |
|---|---|---|---|
| 4,289,816 A | 9/1981 | Fogelberg et al. | |
| 4,485,094 A | 11/1984 | Pebler et al. | |
| 4,617,206 A | 10/1986 | Haisma et al. | |
| 4,931,427 A | 6/1990 | Chien | |
| 5,171,735 A | 12/1992 | Chien | |
| 5,262,394 A | 11/1993 | Wu et al. | |
| 5,318,800 A | 6/1994 | Gong et al. | |
| 5,382,452 A | 1/1995 | Bruno et al. | |
| 5,441,767 A | 8/1995 | DeSaulniers | |
| 5,540,981 A | 7/1996 | Gallagher et al. | |
| 6,027,766 A | 2/2000 | Greenberg et al. | |
| 6,071,489 A * | 6/2000 | Sun et al. | 423/594.4 |
| 6,255,762 B1 | 7/2001 | Sakamaki et al. | |
| 6,410,934 B1 | 6/2002 | Nayfeh et al. | |
| 6,589,457 B1 | 7/2003 | Li et al. | |
| 2005/0043184 A1* | 2/2005 | McCleskey et al. | 505/100 |

OTHER PUBLICATIONS

Lang, "Chemical Solution Routes to Single-Crystal Thin Films," Science, No. 5277, vol. 273, pp. 903-909, 1996.
Schwartz, "Chemical Solution Deposition of Perovskite Thin Films," Chem. Mater., vol. 9, No. 11, pp. 2325-2340, 1997.

* cited by examiner

*Primary Examiner*—Tae H Yoon
(74) *Attorney, Agent, or Firm*—Bruce H. Cottrell

(57) ABSTRACT

A polymer assisted deposition process for deposition of metal oxide films is presented. The process includes solutions of one or more metal precursor and soluble polymers having binding properties for the one or more metal precursor. After a coating operation, the resultant coating is heated at high temperatures to yield metal oxide films. Such films can be epitaxial in structure and can be of optical quality. The process can be organic solvent-free.

18 Claims, 14 Drawing Sheets

POLYMER-ASSISTED DEPOSITION OF FILMS

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to a deposition technique for metal oxide films and more particularly to the polymer assisted solution deposition of metal oxide films, especially for deposition of metal oxide films or epitaxial metal oxide films.

BACKGROUND OF THE INVENTION

Metal oxide films are widely used in the electronics industry. Preparation of such metal oxide films has been accomplished by physical vapor deposition techniques such as sputtering, electron beam (e-beam) evaporation, thermal evaporation, molecular beam epitaxy (MBE) and pulsed laser deposition (PLD), by chemical vapor deposition techniques such as plasma-enhanced chemical vapor deposition (PECVD), low-pressure chemical vapor deposition (LPCVD), and metalorganic chemical vapor deposition (MOCVD), and by sol-gel techniques and other chemical solution deposition techniques. Chemical solution deposition techniques have been generally viewed as less capital intensive (see, Lange, "Chemical Solution Routes to Single-Crystal Thin Films", Science, vol. 273, pp. 903-909, 1996 and Schwartz, "Chemical Solution Deposition of Perovskite Thin Films", Chemical Materials, vol. 9, pp. 2325-2340, 1997). Also, chemical solution techniques are not generally limited to flat surfaces.

Sol-gel techniques are not desirable for many industrial production processes. The sol-gel process uses the high reactivity of organometallic precursors and hydrolyzes these organometallic compounds to make various oligomers. These metal oxo oligomers have suitable viscosity to allow spinning into thin films, which can be fired into ceramic materials at high temperatures. The complication in such a sol-gel process is the uncontrollable polymerization of the metal oxo oligomers because of complex reactive species in the precursor solution. Therefore, the reproducibility of sol-gel processes can be poor which hinders the applications in industrial processes despite the low costs.

The use of organometallic compounds in chemical solution deposition techniques can be a drawback. As metal salts are typically insoluble in organic solvents, organic moieties have been added to the metal complexes in order to make such metal compounds soluble. This is often undesirable as new reactions and techniques must be developed to incorporate such soluble organic groups onto metal ions. In addition, the resulting organometallic compounds are usually difficult to handle because of their relatively higher reactivity than metal salts.

One problem with the processing of metal salts into ceramic thin films involves the hydrolytic properties of metal ions. Transition metal ions, such as titanium, niobium and tantalum, react with water violently to form metal oxides or metal hydroxides and precipitate out of solution during processing. A more desired methodology to achieve metal oxide films would be a chemical solution having the following properties: clean decomposition to pure ceramics; stable chemical solutions (no gelling) without any reactions before the firing stage; and, the desired viscosity for spin coating, spray coating, or film casting.

U.S. Pat. No. 6,589,457 by Li et al. is directed to deposition of metal oxides from aqueous solutions of water-soluble metal precursors and water-soluble polymers. While none of the examples included a polymer other than polyvinyl alcohol, Li et al. illustrate the continuing efforts in the development of chemical solution deposition processes for production of metal oxide films. The present invention is a continuation of those efforts.

An object of the present invention is to provide a chemical solution deposition method of forming metal oxide films, such a chemical solution deposition method including the deposition of a metal precursor and a soluble polymer where the polymer has binding properties for the metal precursor.

Another object of the present invention is to provide a chemical solution deposition method of forming high purity metal oxide films or epitaxial metal oxide films.

Yet another object of the present invention is to provide a metal oxide precursor solution having a long shelf-life time in comparison to typical sol-gel solutions.

SUMMARY OF THE INVENTION

To achieve the foregoing and other objects, and in accordance with the purposes of the present invention, as embodied and broadly described herein, the present invention provides for a process of preparing a metal oxide film including: applying a solution including a metal precursor and a soluble polymer onto a substrate to form a polymer and metal-containing layer thereon, the polymer characterized as having binding properties for the metal precursor; and, heating the substrate having a polymer and metal containing layer thereon at temperatures characterized as sufficient to remove the polymer and form the metal oxide film. In one embodiment, the solution further includes a metal-binding ligand or salts thereof.

The present invention further provides a composition of matter including a solution of at least two metal precursors and a soluble polymer, said polymer characterized as having binding properties for the at least two metal precursors.

BRIEF DESCRIPTION OF THE DRAWINGS

FIG. 9 shows the x-ray diffraction 2θ-scan of a YBa$_2$Cu$_3$O$_{7-x}$ (YBCO) film deposited by the process of present invention on a LaAlO$_3$ substrate. The film is highly c-axis oriented.

DETAILED DESCRIPTION

Figure 1:
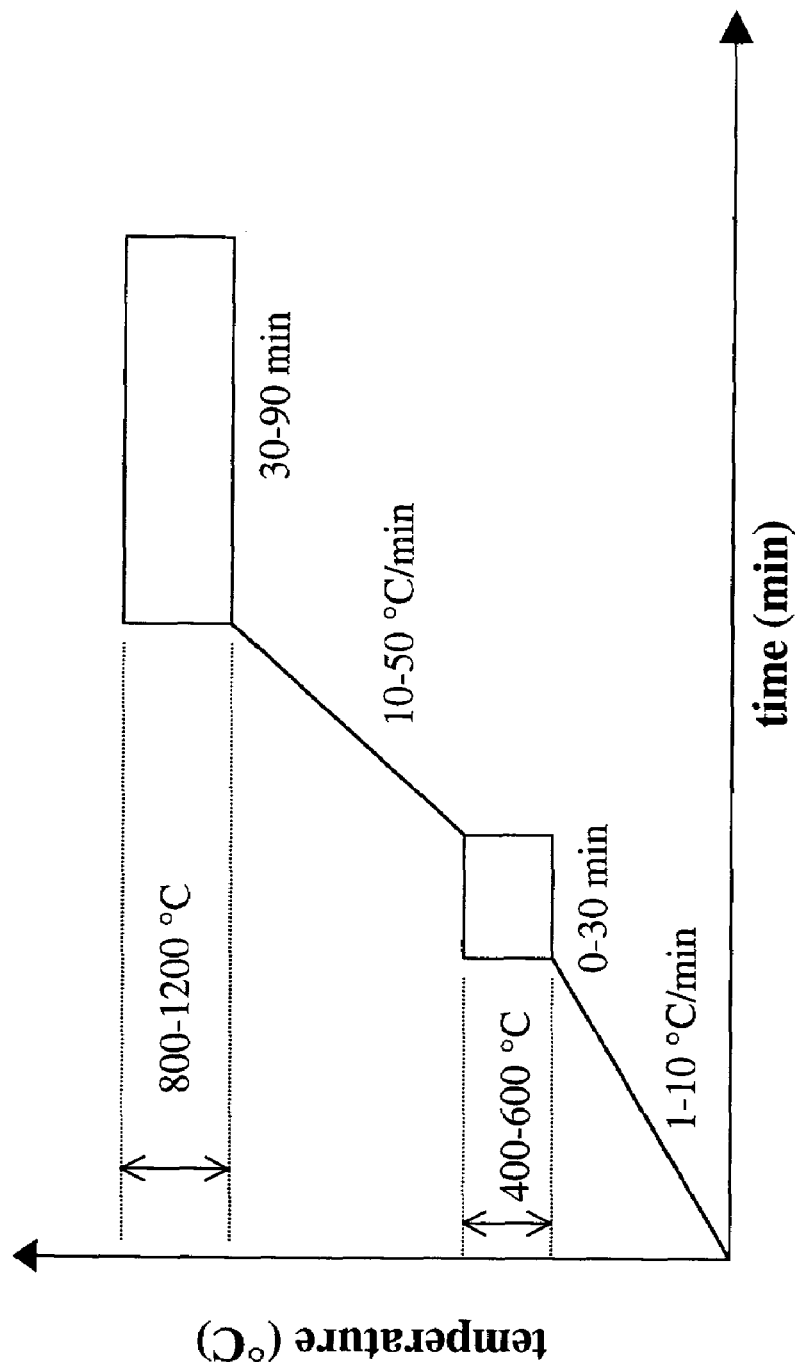
FIG. 1 shows the generic temperature profile of post thermal treatment for epitaxial growth of different oxide films deposited by the polymer assisted deposition technique.

The present invention is concerned with a process for preparing metal oxide films from solutions, optionally in an organic solvent-free process. The metal oxide films can be prepared with an epitaxial structure. The elimination of organic solvents from chemical solution deposition techniques can be preferred in some instances.

The process of the present invention uses a soluble polymer to assist in the deposition of the desired metal oxide. Thus, the process can be referred to as a polymer assisted deposition process. Inclusion of a soluble polymer with a single metal precursor or multiple metal precursors promotes better distribution of the materials during the deposition. The polymer can be removed subsequently by heating at sufficiently high temperatures to eliminate the polymer and leave a metal oxide film. The resultant metal oxide film can be prepared with orientation, i.e., the film can be prepared with an epitaxial structure. By using a soluble polymer in conjunction with one or more metal precursors, single or mixed compound/complex metal oxide films can be prepared. In one embodiment, the overall process can be an aqueous process that can be organic solvent free.

While the metal oxide film can be prepared with an epitaxial structure by the process of the present invention, it may also be prepared with an amorphous structure or a polycrystalline structure by suitable treatment after deposition of the polymer and metal containing layer upon a substrate or by suitable selection of the substrate. Such amorphous or polycrystalline structures may be preferred for some applications.

The soluble polymer used in the present process has binding properties for the metal precursors used to form the metal oxide film and can be, e.g., polyethylenimine (PEI), a substituted PEI such as carboxylated-polyethylenimine (PEIC) or a polymer such as polyacrylic acid, polypyrolidone, and poly(ethylene-maleic acid). PEI or substituted PEIs such as PEIC are generally the preferred polymers. Typically, the molecular weight of such polymers is greater than about 30,000.

In order to have good processing characteristics, a precursor solution for metal oxide films must have a suitable viscosity. In the present invention, polymer plays dual functions. In other words, a polymer is also used to assist the viscosity desired for metal oxide film processing.

The criteria on the choice of polymers are that they be soluble, undergo a clean decomposition upon heating at high temperatures, e.g., temperatures over about 250° C., and are compatible with the metal compounds.

By aiding in the desired viscosity, such polymers can allow processing of the metal oxide precursor solution into desired configurations such as films. The desired viscosity can be achieved through controlling the solution concentration of the soluble polymers and by controlling the molecular weight of the polymer. For high quality homogeneous films, polymer concentrations and the polymer ratio to metal components should be maintained at a proper balance. The rheology of the metal oxide precursor solution can also be important for the morphology and quality of the final metal oxide films. In order to form smooth films, the polymer solution must have suitable rheological properties so that any spin-coated film has no undesired patterns associated with polymer rheological properties.

The polymer further functions as binding agent to the metals within the precursor solution in assisting the formation of an intermediate deposited polymer-metal composite film and ultimately a metal oxide film. This requires that the polymer should also have suitable interactions to metal ions such that no phase separation occurs during the deposition processes. Thereafter, the deposited polymer-metal composite films are heated at high temperatures (calcined), e.g., at temperatures above about 250° C. to obtain the final metal oxide films. Thus, the soluble polymer selection should also have suitable decomposition characteristics, e.g., a clean decomposition under such calcination conditions, so that the final metal oxide film can be free of side products.

The general approach of the present invention can be applied to main group metals, transition group metals and lanthanide metals in forming resultant metal oxides. Among the main group metals are included aluminum, gallium, germanium, indium, tin, antimony, lead, and bismuth.

Among the transition metals are included titanium, vanadium, chromium, manganese, iron, cobalt, nickel, copper, zinc, yttrium, zirconium, niobium, molybdenum, ruthenium, rhodium, cadmium, hafnium, tantalum, tungsten, rhenium, osmium, and iridium.

Among the lanthanide metals are included lanthanum, cerium, praseodymium, neodymium, samarium, europium, gadolinium, terbium, dysprosium, holmium, erbium, thulium, ytterbium and lutetium.

Other metals such as alkaline earth metals including calcium, strontium and barium can generally be one metal component in mixed metal oxides such as calcium titanate, calcium ruthenate, barium titanate, barium ruthenate, strontium titanate, strontium ruthenate, yttrium barium copper oxide. Simple oxides such as MgO and SrO can be also prepared by this method.

Still other metals such as alkali metals including sodium, lithium and potassium may generally be one metal component in mixed metal oxides such as lithium tantalate ($LiTaO_3$), lithium niobate ($LiNbO_3$), Fe- or Ti-doped lithium niobate, potassium barium niobate ($KBa_2Nb_5O_{15}$), potassium lithium niobate ($K_3Li_2Nb_5O_{15}$), potassium sodium tantalate (($K_{1-x}Na_x)TaO_3$), $K_3Li_2(Ta_xNb_{1-x})_5O_{15}$ and the like.

The metal oxide films prepared by the present process can include a metal oxide with a single metal, can be a metal oxide with two metals or three metals or may be a metal oxide including four or more metals. Among the metal oxides preparable by the present process are included titanium oxide, magnesium oxide, zinc oxide, ruthenium oxide and the like. Among the mixed metal oxides preparable by the present process are included barium titanium oxide (barium titanate), strontium titanium oxide (strontium titanate), barium strontium titanium oxide (barium strontium titanate), strontium ruthenium oxide (strontium ruthenate), lanthanum-strontium manganese oxide, yttrium-barium-copper oxide ($YBa_2Cu_3O_7$) and the like. The metal oxide films prepared by the present process can be insulating, resistive, conductive, ferroelectric, ferromagnetic, piezoelectric, and even superconductive depending upon the chemical compositions and micro structures.

The composition, e.g., solution, used for the deposition includes the soluble polymer and the metal precursors. In addition, other metals can be included through addition of appropriate metal salts. For example, barium can be added through a barium salt such as barium acetate. Other suitable metal salts may include metal nitrates, metal oxalates, metal acrylates, and metal coordination complexes.

The solvent for dissolution of the soluble polymer can be, e.g., water, lower alcohols such as methanol, ethanol, propanol and the like, acetone, propylene carbonate, tetrahydrofuran, acetonitrile, acetic acids and mixtures thereof such as water and ethanol and the like. As the soluble polymer used in the present invention includes binding properties for the metals or metal precursors used in formation of the metal oxide films, the polymer can help provide the necessary solubility to the respective metals, e.g., metal precursors. In some instances, the metal can initially be in a metal complex such as a complex of the respective metal with a metal binding ligand or salt thereof such as ethylenediaminetetraaceticacid (EDTA) or salts thereof such as dipotassium ethylenediaminetetraaceticacid. EDTA-metal complexes are generally soluble within solutions including a soluble polymer with binding properties for the metal precursors such as PEI and the like.

Among suitable metal binding ligands besides EDTA and salts thereof can be included other carboxylic acid ligands such as ethylenediaminediaceticacid (EDDA), trans-1,2-diamino-cyclohexan-N,N,N',N'-tetraacetic acid (CDTA), ethyleneglycol-O,O'-bis-(2-aminoethyl)-N,N,N',N'-tetraacetic acid (EGTA), diethylenetriamine-pentaacetic acid (DTPA), N-(2-hydroxyethyl)-ethylenediamine-N,N',N'-triacetic acid (HEDTA), nitrilotriacetic acid (NTA), triethylentetramine-N,N,N',N'',N''',N'''-hexaacetic acid (TTHA) and the like, polypyridyl ligands such as terpyridne, 2,2'-bypyridine, 1,10-phenanthroline and the like, beta-diketone (acetylacetonate) ligands such as 2,4-propanedione and derivatives thereof, catecholate and aryl oxide or alkyl oxide ligands, macrocyclic ligands such as cyclam, cyclen, triazacyclononane and derivatives thereof, or other simple ligands such as aquo ($H_2O$) and amines ($NH_3$), i.e., $Co(NH_3)_6^{2+}$. Shiff-base ligands such as trimethylenediamainetetramethylglyoximato ligand or the salen type ligands may also be used.

The starting solution is typically maintained at ambient temperatures from about 15° C. to about 30° C., more usually from about 20° C. to about 25° C. Within those temperature ranges, the materials added to the solution are soluble. In preparation of solutions used in the present process, the solutions using a polyethylenimine as the metal binding polymer can be filtered prior to use to remove any non-soluble components. One exemplary process in the preparation of the solutions involves filtering the precursor solution through an Amicon ultrafiltration unit containing a PM 10 ultrafiltration membrane. Such a filter is designed to pass materials having a molecular weight of less than about 10,000 g/mol (e.g., unbound metal, smaller polymer fragments and the like) while retaining the desired materials of a larger size. Ultrafiltration allows for removal of any unwanted salts such as cations, anions or other impurities.

The metal ratio can be controlled through appropriate addition of metal precursors to the solvent used in the deposition. Such solutions can generally have a shelf life of more than a year.

In one embodiment of the present invention, the starting solution can be deposited on a desired substrate, e.g., by spray coating, dip coating, spin coating, ink jet printing and the like. After deposition of the starting solution on a substrate, the deposited coating must be calcined or heated at high temperatures of from about 250° C. to about 1300° C., preferably from about 400° C. to about 1200° C. for a period of time sufficient to remove the polymer and to form only the metal oxide film. FIG. 1 shows a general temperature profile of the thermal treatment for growth of metal oxide films deposited by the process of this invention. Heating times may be varied and may be longer depending upon the thickness of the deposited film.

Optionally, the deposited coating can be initially dried by heating to temperatures of from about 50° C. to about 150° C. for from about 15 minutes to several hours, preferably for less than one hour. The deposited polymer-metal oxide film undergoes removal of a percentage of volatile species during such an initial drying stage.

The resultant metal oxide films from the present process have been optical quality films in that they are highly smooth films with a mirror-like appearance. Many of the films have been found to be epitaxial in structure.

The present invention enables the processing of metal oxide films with convenience and flexibility required in industrial fabrication. This process involves making metal oxide films from solutions—optionally in an organic solvent-free process. Barium titanate ($BaTiO_3$) and strontium titanate ($SrTiO_3$) films have been prepared using polymer-assisted aqueous deposition (PAD) techniques. X-ray diffraction measurement indicates that the barium titanate and strontium titanate films on $LaAlO_3$ are preferentially oriented along the (100). They are also epitaxial as confirmed from x-ray φ-scans of the (101) diffraction of the films and transmission electron microscopy.

The polymer is used to bind metals and metal precursors. This allows the removal of any unwanted anions or cations by filtration, e.g., through an Amicon ultrafiltration unit, and brings multiple metals together in a homogeneous manner at a molecular level. This also prevents selective precipitation of unwanted metal oxide phases as a portion of the water can be removed and the metals concentrated within the remaining solution. Even at the extreme of just polymer and metal, the dried solution (a gel) includes only well dispersed metal atoms bound to the polymer. The present invention has extended the potential of controlling relative metal concentrations at the molecular level for mixed metal oxides such as superconductors ($YBa_2Cu_3O_{7-x}$). This can be done in one of three ways.

In a first manner, a single polymer (such as carboxylated polyethyleneimine) can be added to a solution containing simple salts (such as nitrate) of two or more metals in the correct ratio. If the binding constant is high for both metals then they will remain in the correct ratio during filtration and concentration of the polymer.

In a second manner, the metals can be bound individually to one or more polymers and concentrated. The resulting solution can be examined by ICP to determine metal content and then mixed appropriately prior to spin coating. Different polymers and different solvents can be used for different metals in this system.

In a third manner, metal complexes such as a metal-EDTA complex can be prepared and mixed in the desired ratios. These complexes can then be bound to a polymer (such as polyethyleneimine) and concentrated.

The present invention is more particularly described in the following examples which are intended as illustrative only, since numerous modifications and variations will be apparent to those skilled in the art.

Examples A-Z describe the preparation of solutions used in the deposition of the metal oxide films. Examples 1-9 describe the deposition of metal oxide films using such solutions. Polyethylenimine was obtained from BASF as a water free, branched, polymer with an average MW of 50,000. Water was deionized via reverse osmosis (having a resistivity >16 Ohms).

EXAMPLE A

A solution including zinc chloride and polyethylenimine was prepared as follows. An amount of 4.4 grams of polyethylenimine was dissolved in 40 mL of water and the pH was adjusted to pH 6 with addition of 10% HCl. To this solution was added 2.2 grams of $ZnCl_2$ and the solution was stirred. After stirring the solution was placed in an Amicon ultrafiltration unit containing a PM 10 ultrafiltration membrane designed to pass materials having a molecular weight <10,000 g/mol. The solution was diluted to 200 mL and then concentrated to 45 mL in volume. Inductively coupled plasma-atomic emission spectroscopy showed that the final solution had 21.1 mg/mL of Zn.

EXAMPLE B

A solution including zinc nitrate and polyethylenimine was prepared as follows. An amount of 2.0 grams of polyethylenimine was dissolved in 40 mL of water and the pH was adjusted to pH 6 with addition of 10% HCl. To this solution was added 2.5 grams of zinc nitrate hexahydrate and the solution was stirred. After stirring the solution was placed in an Amicon ultrafiltration unit containing a PM 10 ultrafiltration membrane designed to pass materials having a molecular weight <10,000 g/mol. The solution was diluted to 200 mL and then concentrated to 20 mL in volume. Inductively coupled plasma-atomic emission spectroscopy showed that the final solution had 24.2 mg/mL of Zn.

EXAMPLE C

A solution including zinc chloride, dipotassium ethylenediaminetetraaceticacid (EDTA $K_2$) and polyethylenimine was prepared as follows. An amount of 2.0 grams of dipotassium ethylenediaminetetraaceticacid was dissolved in 30 mL of water. To this solution was added 0.75 grams of zinc chloride and the solution was stirred. After stirring, 2 grams of polyethylenimine were added and the pH was adjusted to 9 with addition of 10% HCl. The solution was placed in an Amicon ultrafiltration unit containing a PM 10 ultrafiltration membrane designed to pass materials having a molecular weight <10,000 g/mol. The solution was diluted to 200 mL and then concentrated to 20 mL in volume. Inductively coupled plasma-atomic emission spectroscopy showed that the final solution had 24.2 mg/mL of Zn.

EXAMPLE D

A solution including copper nitrate and polyethylenimine was prepared as follows. One gram of polyethylenimine (from BASF) was placed in a 50 mL Falcon tube and dissolved in 25 mL of water. Then, 0.85 grams of copper nitrate trihydrate were added. After stirring the solution was placed in an Amicon ultrafiltration unit containing a PM 10 ultrafiltration membrane designed to pass materials having a molecular weight <10,000 g/mol. The solution was diluted to 200 mL and then concentrated to 10 mL in volume. Inductively coupled plasma-atomic emission spectroscopy showed that the final solution had 15.2 mg/mL of Cu.

EXAMPLE E

A solution including copper nitrate, ethylenediaminetetraaceticacid and polyethylenimine was prepared as follows. One gram of ethylenediaminetetraaceticacid was placed in a 50 mL Falcon tube and 25 mL of water were added. The ethylenediaminetetraaceticacid does not dissolve at this stage. One gram of polyethylenimine (from BASF) was added to the solution and the solution was agitated until the ethylenediaminetetraaceticacid and the polyethylenimine were in solution. Then 0.85 grams of copper nitrate trihydrate were added. After stirring the solution was placed in an Amicon ultrafiltration unit containing a PM 10 ultrafiltration membrane designed to pass materials having a molecular weight <10,000 g/mol. The solution was diluted to 200 mL and then concentrated to 10 mL in volume. Inductively coupled plasma-atomic emission spectroscopy showed that the final solution had 15.2 mg/mL of Cu.

EXAMPLE F

A solution including yttrium nitrate, ethylenediaminetetraaceticacid and polyethylenimine was prepared as follows. One gram of ethylenediaminetetraaceticacid was placed in a 50 mL Falcon tube and 25 mL of water were added. The ethylenediaminetetraaceticacid does not dissolve at this stage. One gram of polyethylenimine (from BASF) was added to the solution and the solution was agitated until the ethylenediaminetetraaceticacid and the polyethylenimine were in solution. Then 1.36 grams of yttrium nitrate hexahydrate were added. After stirring the solution was placed in an Amicon ultrafiltration unit containing a PM 10 ultrafiltration membrane designed to pass materials having a molecular weight <10,000 g/mol. The solution was diluted to 200 mL and then concentrated to 10 mL in volume. Inductively coupled plasma-atomic emission spectroscopy showed that the final solution had 15.3 mg/mL of Y.

EXAMPLE G

A solution including barium nitrate, ethylenediaminetetraaceticacid and polyethylenimine was prepared as follows. One gram of ethylenediaminetetraaceticacid was placed in a 50 mL Falcon tube and 25 mL of water were added. The ethylenediaminetetraaceticacid does not dissolve at this stage. One gram of polyethylenimine (from BASF) was added to the solution and the solution was agitated until the ethylenediaminetetraaceticacid and the polyethylenimine were in solution. Then 0.90 grams of barium nitrate were added. After stirring the solution was placed in an Amicon ultrafiltration unit containing a PM 10 ultrafiltration membrane designed to pass materials having a molecular weight <10,000 g/mol. The solution was diluted to 200 mL and then concentrated to 10 mL in volume. Inductively coupled plasma-atomic emission spectroscopy showed that the final solution had 29.5 mg/mL of Ba.

EXAMPLE H

A solution including barium hydroxide, ethylenediaminetetraaceticacid and polyethylenimine was prepared as follows. An amount of 1.4 grams of ethylenediaminetetraaceticacid was placed in a 50 mL Falcon tube and 25 mL of water were added. The ethylenediaminetetraaceticacid does not dissolve at this stage. 1.4 grams of polyethylenimine (from BASF) were added to the solution and the solution was agitated until the ethylenediaminetetraaceticacid and the polyethylenimine were in solution. Then 1.50 grams of water insoluble barium hydroxide octahydrate were added. After stirring the solution was placed in an Amicon ultrafiltration unit containing a PM 10 ultrafiltration membrane designed to pass materials having a molecular weight <10,000 g/mol. The solution was diluted to 200 mL and then concentrated to 14 mL in volume. Inductively coupled plasma-atomic emission spectroscopy showed that the final solution had 28.8 mg/mL of Ba.

EXAMPLE I

A solution including titanium and peroxide and PEIC was prepared as follows. An amount of 1.0 gram of PEIC (PEI with ½ of the amine sites functionalized into carboxylates) was dissolved in 30 mL of water. A solution of soluble titanium was prepared by placing 2.5 grams of 30% peroxide into 30 mL of water and then slowly adding 2.5 grams of titanium tetrachloride. Small aliquots of 1 mL of the titanium solution were then added to the PEIC solution and the pH was monitored as the pH increased above 3.5 aliquots of 10% NaOH were added to lower the pH to 7.5. This process was repeated until addition of the titanium solution resulted in precipitate that would not dissolve. The solution was then filtered and was placed in an Amicon ultrafiltration unit containing a PM 10 ultrafiltration membrane designed to pass materials having a molecular weight <10,000 g/mol. The solution was diluted to 200 mL and then concentrated to 10 mL in volume. Inductively coupled plasma-atomic emission spectroscopy showed that the final solution had 4.6 mg/mL of Ti.

EXAMPLE J

A solution including strontium nitrate and ethylenediaminetetraaceticacid and polyethylenimine was prepared as follows. An amount of 1.7 grams of ethylenediaminetetraaceticacid was placed in a 50 mL Falcon tube and 25 mL of water were added. The ethylenediaminetetraaceticacid does not dissolve at this stage. 1.7 grams of polyethylenimine (from BASF) were added to the solution and the solution was agitated until the ethylenediaminetetraaceticacid and the polyethylenimine were in solution. Then 1.22 grams of strontium nitrate were added. After stirring the solution was placed in an Amicon ultrafiltration unit containing a PM 10 ultrafiltration membrane designed to pass materials having a molecular weight <10,000 g/mol. The solution was diluted to 200 mL and then concentrated to 17 mL in volume. Inductively coupled plasma-atomic emission spectroscopy showed that the final solution had 16.0 mg/mL of Sr.

EXAMPLE K

A solution including cadmium nitrate and ethylenediaminetetraaceticacid and polyethylenimine was prepared as follows. An amount of 2.0 grams of polyethylenimine was dissolved in 40 mL of water and the pH was adjusted to pH 6 with addition of 10% HCl. 2.5 grams of cadmium nitrate tetrahydrate were added and the solution was stirred. After stirring the solution was placed in an Amicon ultrafiltration unit containing a PM 10 ultrafiltration membrane designed to pass materials having a molecular weight <10,000 g/mol. The solution was diluted to 200 mL and then concentrated to 20 mL in volume. Inductively coupled plasma-atomic emission spectroscopy showed that the final solution had 37.6 mg/mL of Cd.

EXAMPLE L

A solution including indium nitrate, ethylenediaminetetraaceticacid and polyethylenimine was prepared as follows. One gram of ethylenediaminetetraaceticacid was placed in a 50 mL Falcon tube and 25 mL of water were added. The ethylenediaminetetraaceticacid does not dissolve at this stage. One gram of polyethylenimine was added to the solution and the solution was agitated until the ethylenediaminetetraaceticacid and the polyethylenimine were in solution. Then 1.00 grams of indium nitrate were added. After stirring the solution was placed in an Amicon ultrafiltration unit containing a PM 10 ultrafiltration membrane designed to pass materials having a molecular weight <10,000 g/mol. The solution was diluted to 200 mL and then concentrated to 10 mL in volume. Inductively coupled plasma-atomic emission spectroscopy showed that the final solution had 14.2 mg/mL of In.

EXAMPLE M

A solution including tin(II) chloride and PEIC was prepared as follows. An amount of 1.0 gram of PEIC (PEI with ½ of the amine sites functionalized into carboxylates) was dissolved in 30 mL of water. To this solution was added 0.65 grams of tin(II) chloride. After stirring the solution was placed in an Amicon ultrafiltration unit containing a PM 10 ultrafiltration membrane designed to pass materials having a molecular weight <10,000 g/mol. The solution was diluted to 200 mL and then concentrated to 10 mL in volume.

Inductively coupled plasma-atomic emission spectroscopy showed that the final solution had 15.5 mg/mL of Sn.

EXAMPLE N

A solution including gallium chloride and polyethylenimine in ethanol was prepared as follows. An amount of 5 grams of polyethylenimine were dissolved in 95 grams of ethanol. The solution was dried over molecular sieves for two days and then filtered through a 0.49 micron filter. About 20 mL of the solution were placed in a 50 mL Falcon tube and 0.6 grams of gallium chloride were added in an inert atmosphere. A precipitate appears and then dissolves into solution. This solution was placed in an Amicon ultrafiltration unit containing a YM 10 ultrafiltration membrane designed to pass materials having a molecular weight <10,000 g/mol. The solution was diluted to 200 mL with absolute ethanol and then concentrated to 10 mL in volume. After filtration, the viscosity of the solution was further increased by removing a small amount of solvent by rotary evaporation under reduced pressure. Inductively coupled plasma-atomic emission spectroscopy showed that the final solution had 14.3 mg/mL of Ga.

EXAMPLE O

A solution including indium and tin was prepared as follows. An amount of 5.0 grams of the final solution from example L was mixed with 5.0 grams of the final solution from example M to yield a solution equal molar in In and Sn.

EXAMPLE P

A solution including barium and titanium was prepared as follows. An amount of 5.0 grams of the final solution from example I was mixed with 2.21 grams of the final solution from example G to yield a solution equal molar in Ti and Ba.

EXAMPLE Q

A solution including strontium and titanium was prepared as follows. An amount of 5.0 grams of the final solution from example I was mixed with 2.59 grams of the final solution from example J to yield a solution equal molar in Ti and Sr.

EXAMPLE R

A solution including yttrium barium and copper was prepared as follows. An amount of 5.0 grams of the final solution from example F was mixed with 8.0 grams of the final solution from example G and 10.0 grams of the final solution from example E to yield a solution with molar ratios of 1:2:3 for Y:Ba:Cu.

EXAMPLE S

A solution including yttrium barium and copper was prepared as follows. A $YBa_2Cu_3$ solution was also prepared by addition of 2.0 grams polyethylenimine and 2.0 grams ethylenediaminetetraacetic acid to a solution of the metal nitrates having an a ratio of metal of Y:Ba:Cu equal to 1:2:3 (0.47 grams yttrium nitrate hexahydrate, 0.64 grams barium nitrate and 0.89 grams copper nitrate trihydrate). The solution was then concentrated by rotary evaporation under reduced pressure. This solution can be used for coating without filtration since nitrates decompose readily to gases. Alternatively hydroxide and other salts that thermally degrade can also be used.

EXAMPLE T

A solution including cadmium and zinc and polyethylenimine was prepared as follows. An amount of 2.0 grams of polyethylenimine was dissolved in 40 mL of water and the pH was adjusted to pH 6 with addition of 10% HCl. To this solution was added 1.6 grams of zinc nitrate hydrate and 0.4 grams of cadmium nitrate tetrahydrate and the solution was stirred. After stirring the solution was placed in an Amicon ultrafiltration unit containing a PM 10 ultrafiltration membrane designed to pass materials having a molecular weight <10,000 g/mol. The solution was diluted to 200 mL and then concentrated to 20 mL in volume. Inductively coupled plasma-atomic emission spectroscopy showed that the final solution had 18.5 mg/mL of Zn and 6.9 mg/mL of Cd.

EXAMPLE U

A solution including gallium-doped zinc was prepared as follows. An amount of 200 mg of the concentrated solution from example N was mixed with 3.8 grams of the solution from example B. The resulting solution was clear and homogenous. This method can be used to generate a wide variety of gallium doped zinc solutions by simply mixing in the appropriate ratios.

EXAMPLE V

A solution including europium chloride and PEIC was prepared as follows. A europium solution with a carboxylated form of polyethylenimine (PEIC) was prepared by mixing 2.39 g of $EuCl_3 \cdot 6H_2O$ with 1.52 g of the polymer. It was then filtered by the Amicon ultrafiltration unit containing a PM 10 ultrafiltration membrane with 200 mL of water and concentrated to 11.5 mL. The resulting solution of 13 wt % PEI and 0.49 wt % Eu was used for spin coating

EXAMPLE W

A solution including zirconyl nitrate and polyethylenimine was prepared as follows. An amount of 1.0 grams of dipotassium ethylenediaminetetraacetic acid was dissolved in 30 mL of water. To this solution was added 2.0 grams of zirconyl nitrate (35 wt % in water) and the solution was stirred. Polyethylenimine (1 gram) was then added to the solution and the solution was stirred. The resulting solution is clear and has a pH of 8.0. This solution was placed in an Amicon ultrafiltration unit containing a PM 10 ultrafiltration membrane designed to pass materials having a molecular weight <10,000 g/mol. The solution was diluted to 200 mL with absolute ethanol and then concentrated to 10 mL in volume. Inductively coupled plasma-atomic emission spectroscopy showed that the final solution had 19.3 mg/mL of Sr.

EXAMPLE X

A solution including titanium catecholate and polyethylenimine was prepared as follows. Titanium solutions were prepared using a titanium catecholate precursor. A solution of 2 g of PEI in 40 mL of deionized water was added to a mixture containing 2 g of $Ti(cat)_3(NH_4)_2$ dissolved in 20 mL of deionized water. This deep red solution was then heated for 20 minutes at 80° C. Upon cooling a precipitate was observed. The solution was stirred for a further 24 hrs at room temp then filtered through Celite. The deep red solution was filtered using an Amicon ultrafiltration unit containing a PM 10 ultrafiltration membrane, to give clean solution. Inductively coupled plasma-atomic emission spectroscopy showed that the final solution had 1.4 mg/mL of Ti.

EXAMPLE Y

A solution including barium titanium catecholate and polyethylenimine was prepared as follows. An amount of 500 mg of BaTi(cat)$_3$ was dissolved in 40 mL of water. This was then added to a solution of PEIC (2 g PEIC dissolved in 40 mL of water). This deep red solution was stirred for 24 hrs and then all of the solvent was removed at reduced pressure. The resultant oil was resdisolved in water (40 mL) and filtered through Celite to give a clear solution.

EXAMPLE Z

A solution including yttrium, barium and copper was prepared as follows. Three equimolar solutions of yttrium nitrate (1.36 grams yttrium nitrate hexahydrate, 1.0 grams ethylenediaminetetraacetic acid, 1.2 grams polyethylenimine, 30 mL water), barium nitrate (0.90 grams barium nitrate, 1.0 grams ethylenediaminetetraacetic acid, 1.2 grams polyethylenimine, 30 mL water), and copper nitrate (0.85 grams copper nitrate trihydrate, 1.0 grams ethylenediaminetetraacetic acid, 1.2 grams polyethylenimine, 30 mL water) with ethylenediamine tetraacetic acid and polyethylenimine were prepared and then mixed in a 1:2:3 ration Y:Ba:Cu. The final solution was concentrated by rotary evaporation under reduced pressure.

EXAMPLE 1

The europium metal containing solution from Example V was used to spin coat films onto substrates of lanthanum aluminum oxide (LaAlO$_3$). Spin coating was readily achieved with a spinning speed of 1500 rpm over 30 seconds. (Spin Coater Model 100, from Cost Effective Equipment, a division of Brewer Science, Inc., Rolla, Mo.)

Figure 2:
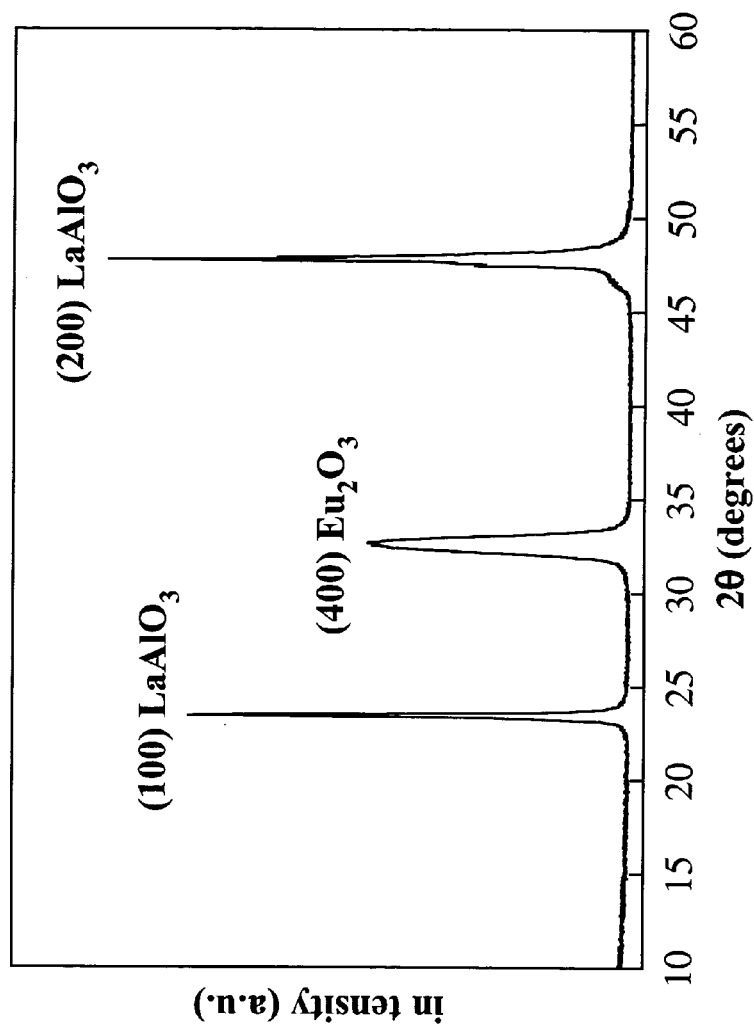
FIG. 2 shows the x-ray diffraction 2θ-scan of a europium oxide ($Eu_2O_3$) film deposited by the process of the present invention on a lanthanum aluminate ($LaAlO_3$) substrate. The film is preferentially oriented out of the plane.
Figure 3:
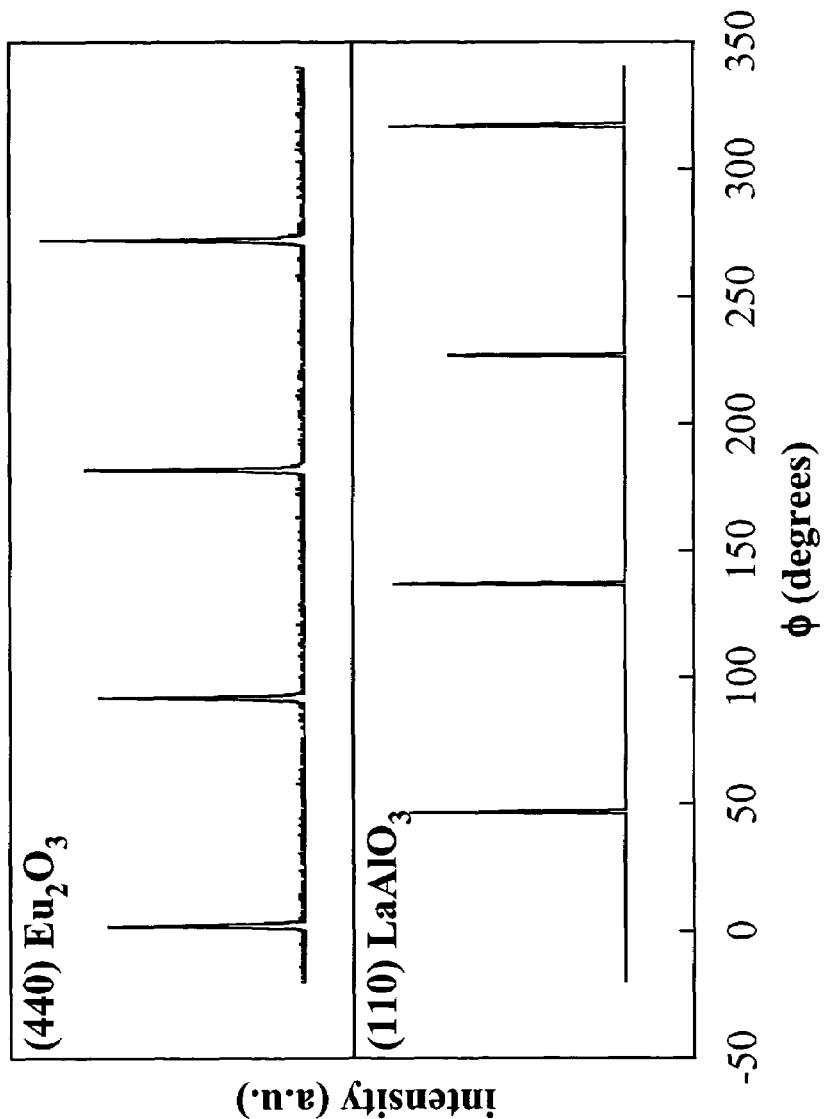
FIG. 3 shows the x-ray diffraction φ-scan of (440) $Eu_2O_3$ deposited by the process of the present invention on a $LaAlO_3$ (110) substrate. The film is also oriented in the plane.
Figure 4:
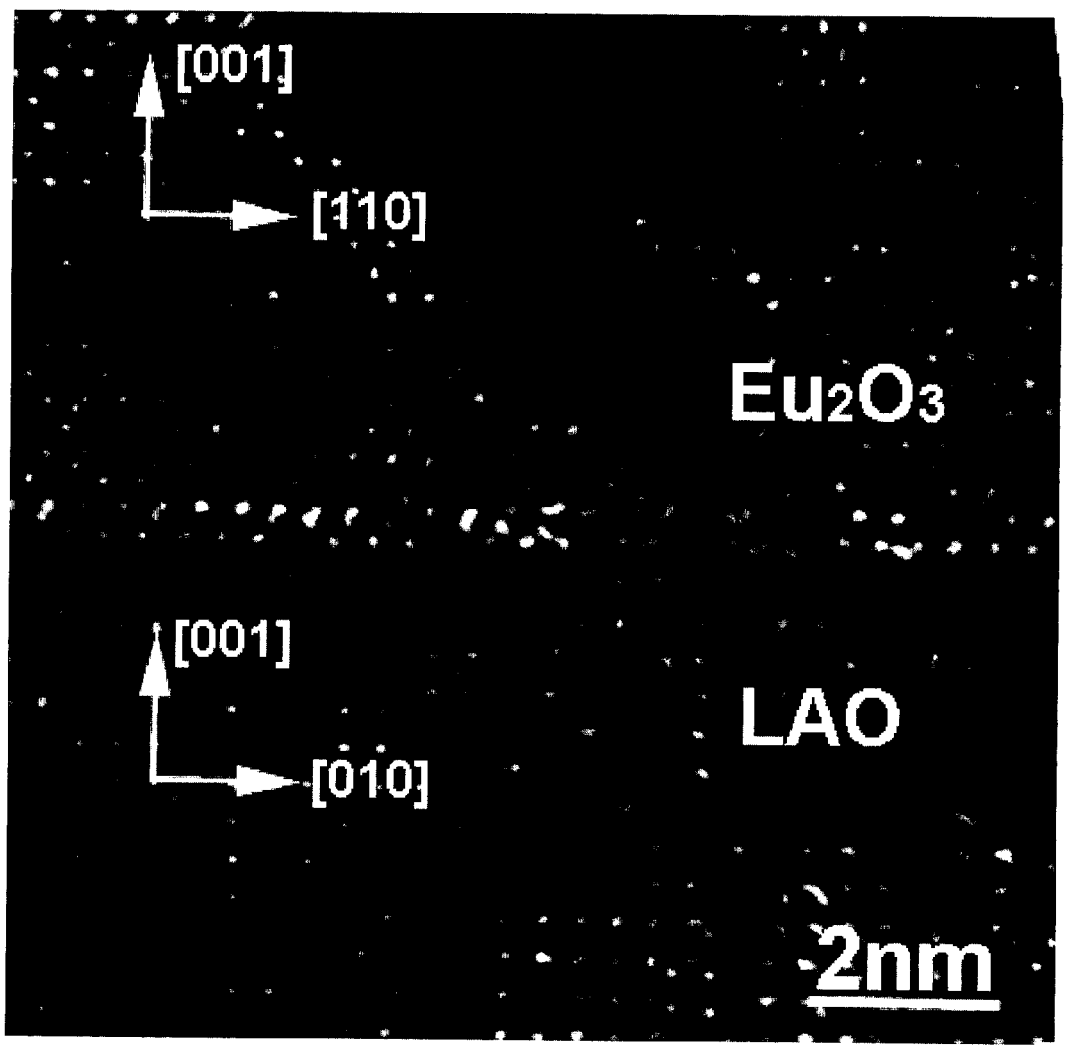
FIG. 4 shows a cross-sectional photomicrograph of a high resolution transmission electron microscopy (TEM) of a $Eu_2O_3$ film deposited by the process of the present invention on a $LaAlO_3$ substrate. The interface between the substrate and the film is very sharp. No voids and second phases were detected in the film.
Figure 5:
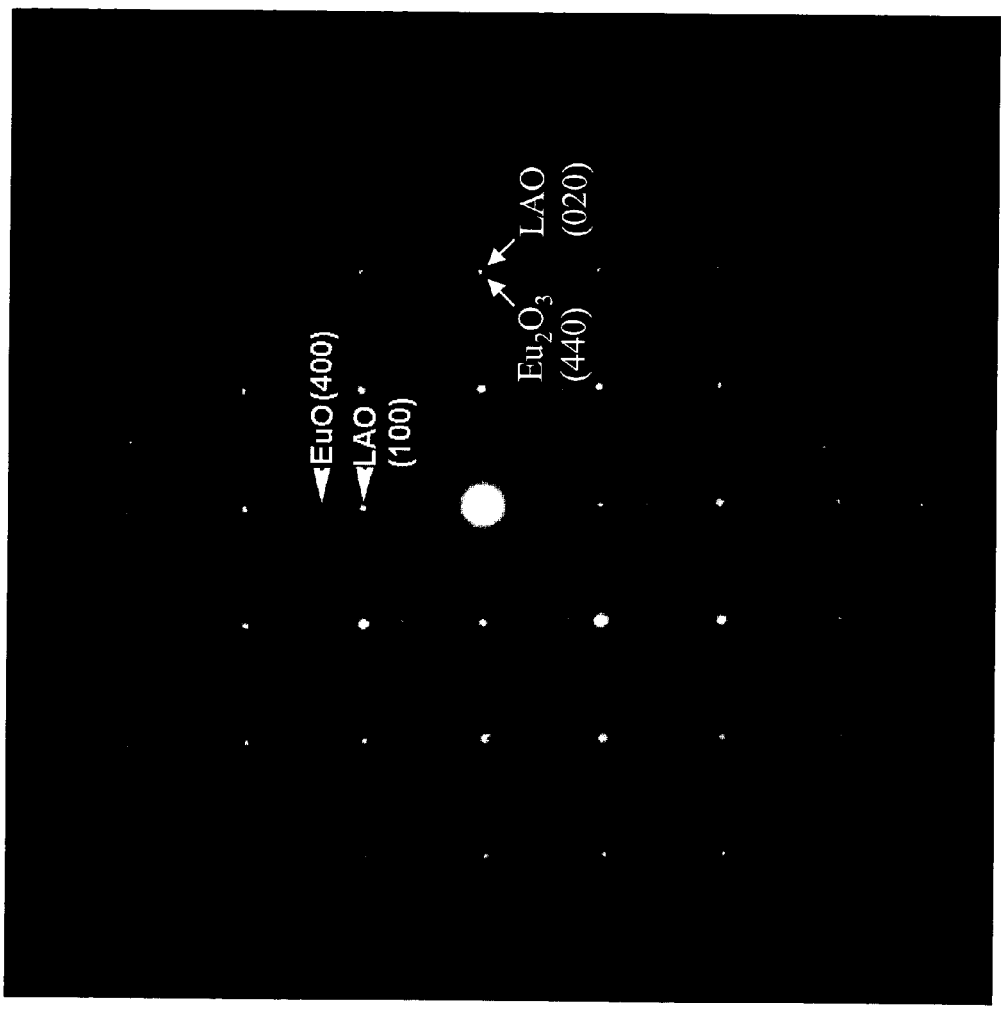
FIG. 5 shows a selected electron diffraction pattern of a $Eu_2O_3$ film deposited by the process of the present invention on a LaAlO$_3$ substrate. The epitaxial nature of the film can be clearly seen from this diffraction pattern.

The resultant coating of polyethylenimine and europium metal was gradually heated from room temperature to about 1000-1200° C. over a period of about one hour under an oxygen atmosphere. FIG. 1 shows the general temperature profile of the thermal treatment for epitaxial growth of films deposited by the process of this invention. This heating process yielded polymer-free metal oxide films on the LaAlO$_3$ substrates. An x-ray diffraction 2θ-scan of the resultant europium oxide (Eu$_2$O$_3$) film is shown in FIG. 2. The film was preferentially oriented out of the plane. FIG. 3 shows the φ-scans of (440) Eu$_2$O$_3$ and (101) LaAlO$_3$. The film is also oriented in the plane. The epitaxial nature of the film deposited using this invention is further evidenced by the transmission electron microscopy as shown in FIG. 4 (high-resolution transmission electron microscopy) and FIG. 5 (selected electron diffraction pattern of a Eu$_2$O$_3$ film on the LaAlO$_3$ substrate). The interface between the substrate and the Eu$_2$O$_3$ film is very sharp. No voids and second phases were detected in the film.

EXAMPLE 2

The titanium metal containing solution from Example I was used to spin coat films onto R-cut sapphire substrates. Spin coating was readily achieved with a spinning speed of 1500 rpm over 30 seconds.

Figure 6:
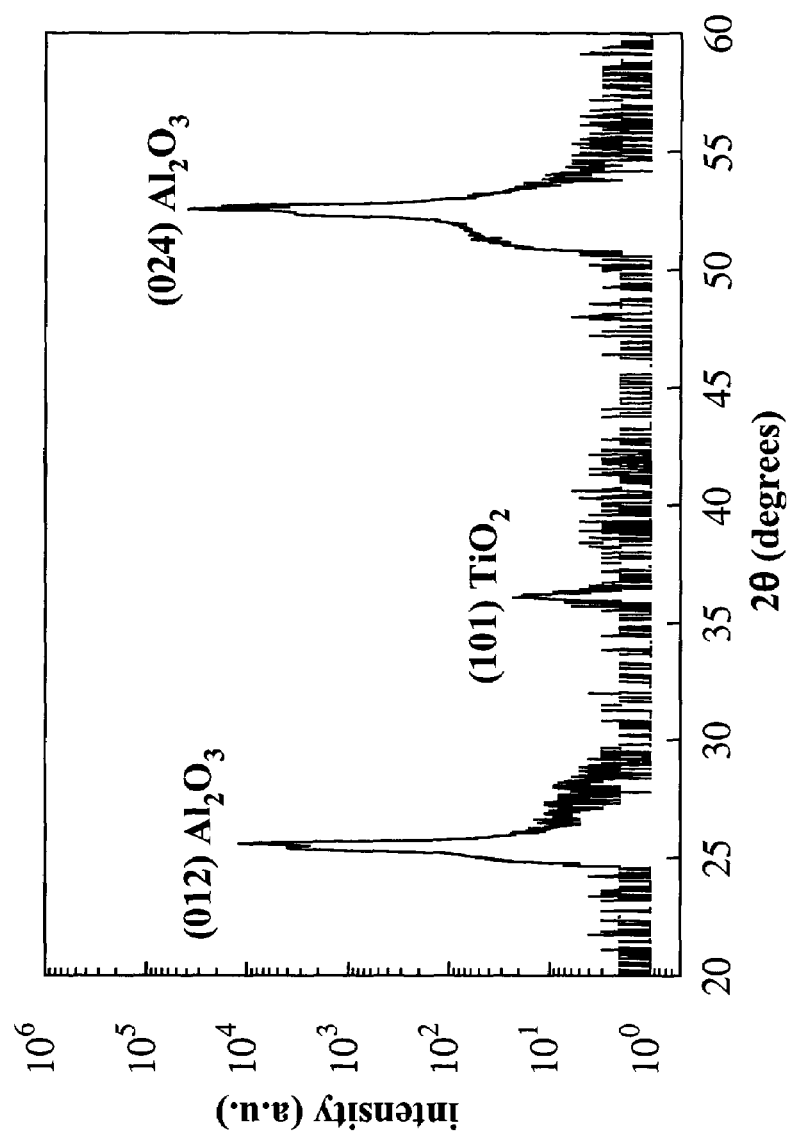
FIG. 6 shows the x-ray diffraction 2θ-scan of a titanium oxide (TiO$_2$) film deposited by the process of the present invention on a R-cut sapphire substrate. The film has a rutile structure and is preferentially oriented out of the plane.

The resultant coating of polyethylenimine and titanium metal was gradually heated from room temperature to about 1100-1200° C. over a period of about one hour under an oxygen atmosphere. This heating process yielded polymer-free metal oxide films on the sapphire substrates. The x-ray diffraction 2θ-scan of the titanium oxide (TiO$_2$) film on the R-cut sapphire substrate is shown in FIG. 6. The film has a rutile structure and was preferentially oriented out of the plane. The epitaxial nature of the rutile TiO$_2$ on R-cut sapphire is further evidenced by the high-resolution transmission electron microscopy and selected electron diffraction pattern (not shown over here). The interface between the substrate and the TiO$_2$ film is very sharp. No voids and second phases were detected in the film.

EXAMPLE 3

The titanium metal containing solution from Example I was used to spin coat films onto LaAlO$_3$ substrates. Spin coating was readily achieved with a spinning speed of 1500 rpm over 30 seconds.

Figure 7:
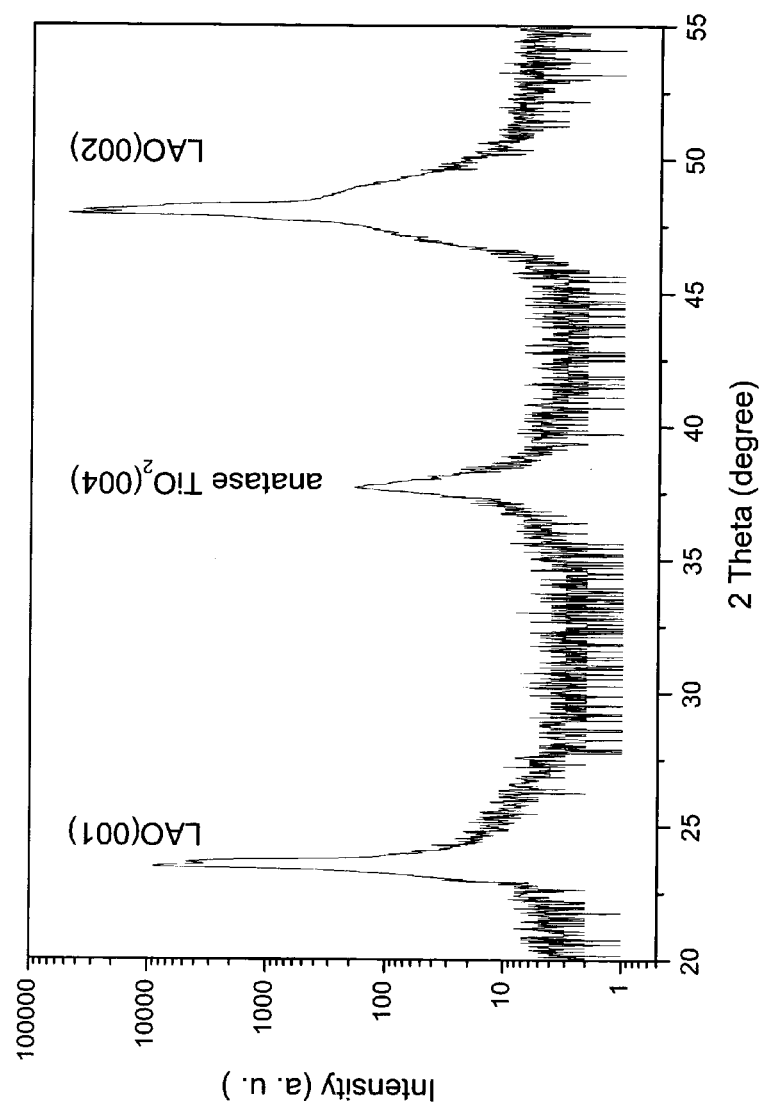
FIG. 7 shows the x-ray diffraction 2θ-scan of a titanium oxide (TiO$_2$) film deposited by the process of present invention on a lanthanum aluminate (LaAlO$_3$) substrate. The film has an anatase structure and is preferentially oriented out of the plane.
Figure 8:
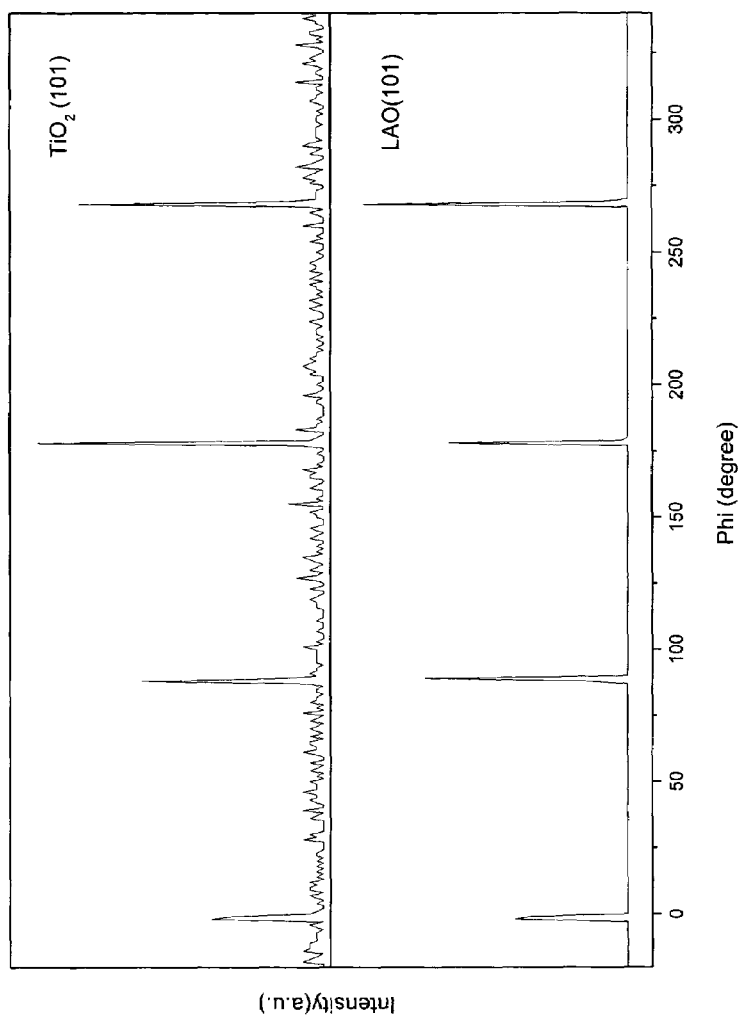
FIG. 8 shows the x-ray diffraction φ-scan of anatase (101) TiO$_2$ and (101) LaAlO$_3$ substrate. The anatase phase is formed by the process of present invention. The film is oriented in the plane.
Figure 7:
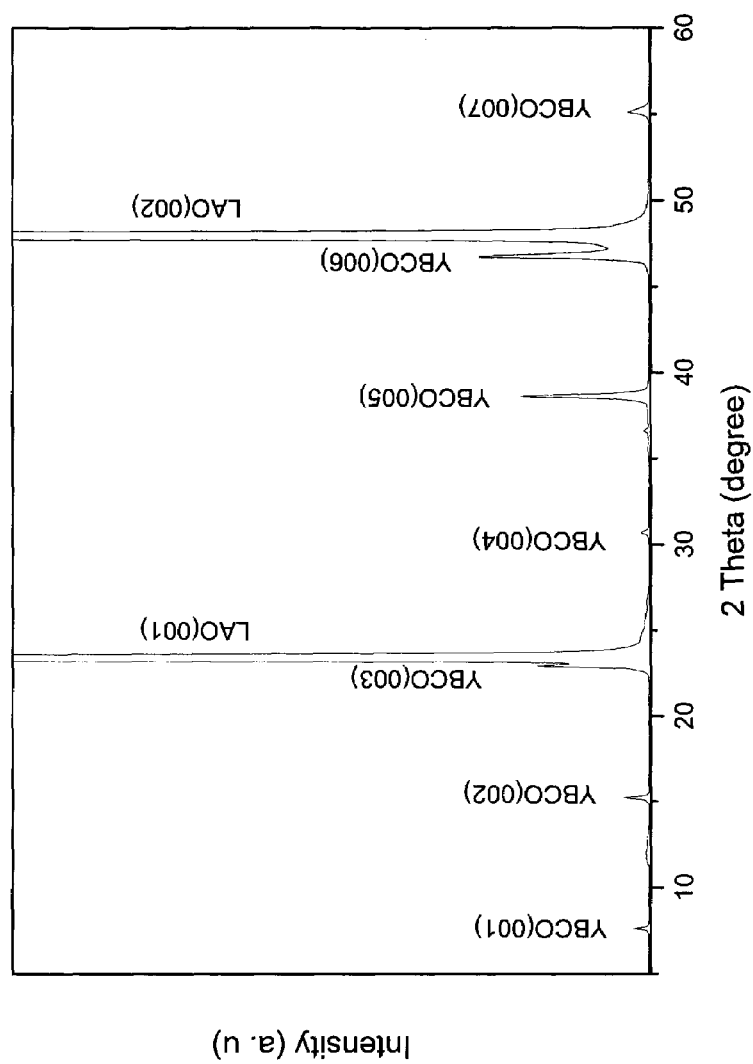

The resultant coating of polyethylenimine and titanium metal was gradually heated from room temperature to about 980° C. over a period of about one hour under an oxygen atmosphere. This heating process yielded polymer-free metal oxide films on the sapphire substrates. The x-ray diffraction 2θ-scan of the titanium oxide (TiO$_2$) film on the LaAlO$_3$ substrate is shown in FIG. 7. The film has an anatase structure and was preferentially oriented out of the plane. The epitaxial nature of the anatase TiO$_2$ on LaAlO$_3$ is further evidenced by the φ-scans of (101) TiO$_2$ and (101) LaAlO$_3$ as shown in FIG. 8.

EXAMPLE 4

The zinc metal containing solutions from Example A, B or C were used to spin coat films onto c-cut sapphire substrates. Spin coating was readily achieved with a spinning speed of 1500 rpm over 30 seconds.

The resultant coatings of polyethylenimine and zinc metal were gradually heated from room temperature to about 750-1200° C. over a period of about one hour under an oxygen atmosphere. This heating process yielded polymer-free metal oxide films on the sapphire substrates. The epitaxial nature of the zinc oxide on c-cut sapphire was evidenced by the high-resolution transmission electron microscopy and selected electron diffraction pattern (not shown over here). The interface between the substrate and the zinc oxide film is very sharp. No voids and second phases were detected in the film.

It should be noted that no significant difference (in terms of the structure) was found between the solutions prepared from example A, B or C. However, the zinc oxide film has better surface morphology as detected from the optical scope where solution C was used.

EXAMPLE 5

The yttrium, barium and copper metal containing solution from Example Z was used to spin coat films onto LaAlO$_3$ substrates. Spin coating was readily achieved with a spinning speed of 1500 rpm over 30 seconds.

Figure 10:
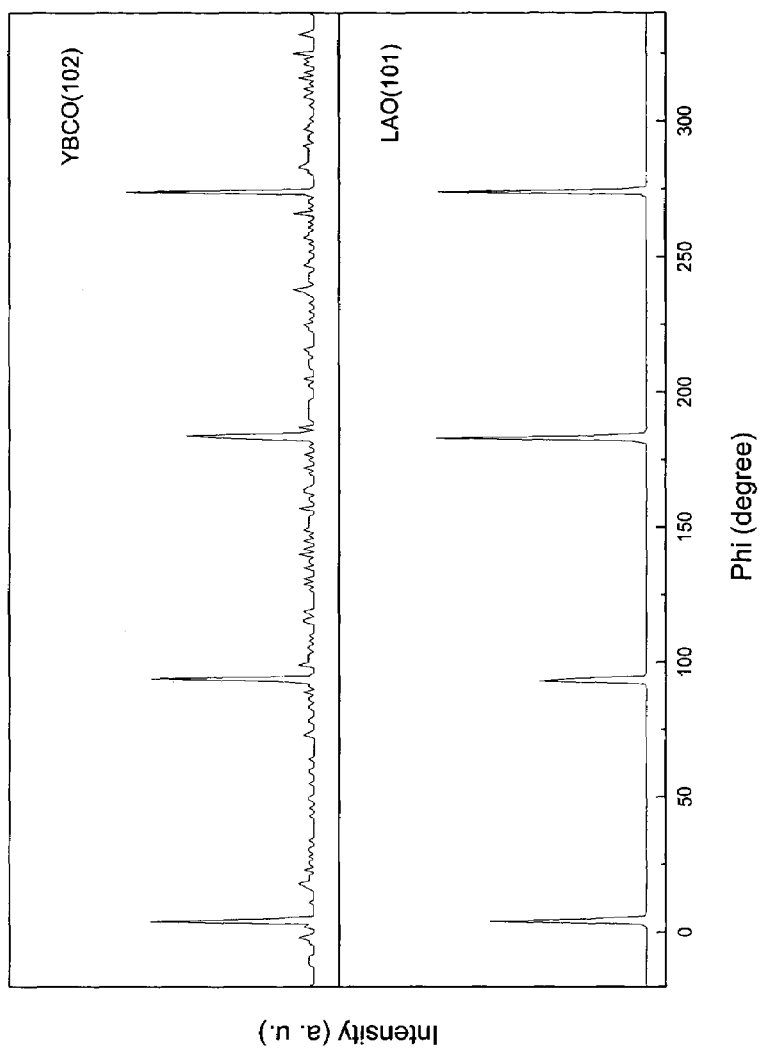
FIG. 10 shows the x-ray diffraction φ-scan of (102) YBCO and (101) LaAlO$_3$ substrate. The film was deposited by the process of present invention. The YBCO is epitaxial as seen by FIGS. 9 and 10.

The resultant coating of polyethylenimine and yttrium, barium and copper metal was gradually heated from room temperature to about 800-980° C. over a period of about one hour under an oxygen atmosphere. This heating process yielded polymer-free metal oxide films of YBCO on the substrates. The x-ray diffraction 2θ-scan of the YBCO film on the LaAlO$_3$ substrate is shown in FIG. 9. The film is highly c-axis oriented and shows no detectable second phase. The epitaxy nature of the YBCO on LaAlO$_3$ is further evidenced by the φ-scans of (102) YBCO and (101) LaAlO$_3$ as shown in FIG. 10.

EXAMPLE 6

The barium and titanium metal containing solution from Example P was used to spin coat films onto LaAlO$_3$ substrates. Spin coating was readily achieved with a spinning speed of 1500 rpm over 30 seconds.

Figure 11:
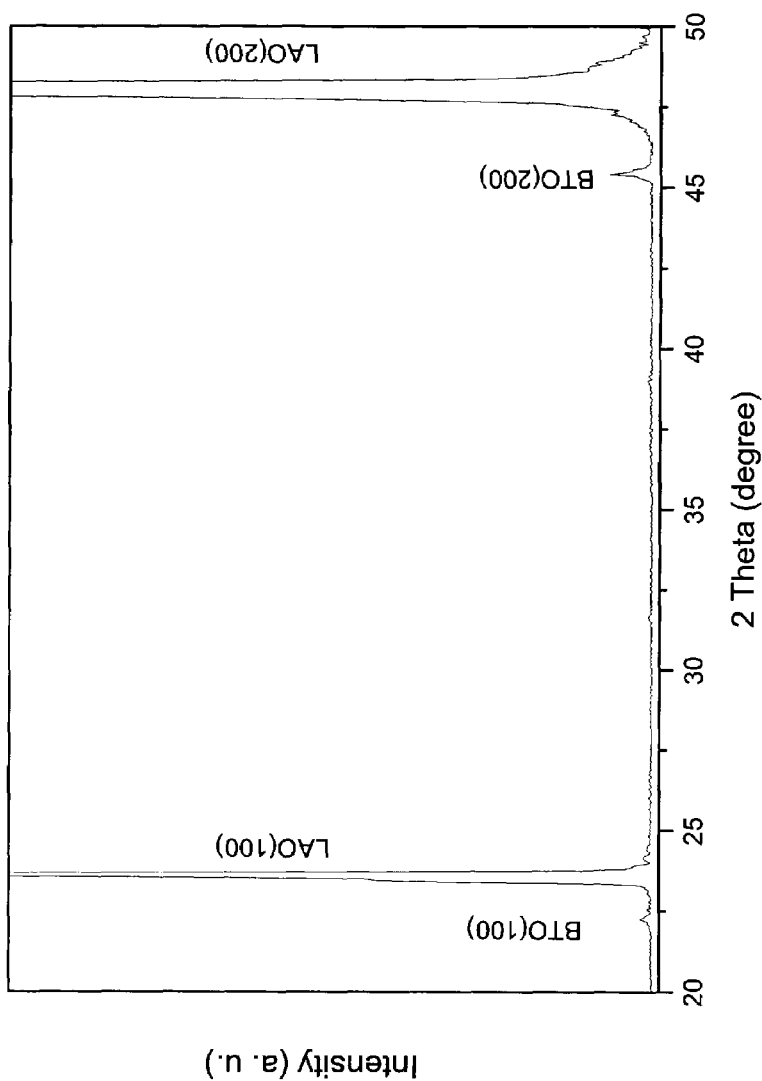
FIG. 11 shows the x-ray diffraction 2θ-scan of a BaTiO$_3$ film deposited by the process of present invention on a LaAlO$_3$ substrate. The film is highly oriented out of the plane.
Figure 12:
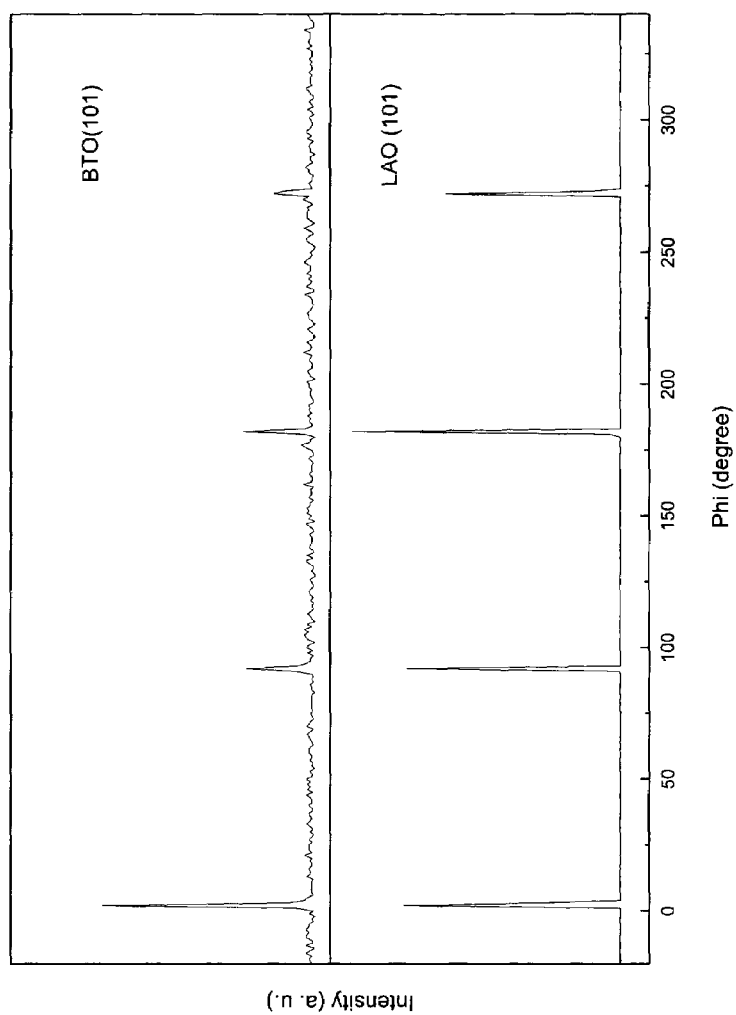
FIG. 12 shows the x-ray diffraction φ-scan of (101) BaTiO$_3$ and (101) LaAlO$_3$ substrate. The film was deposited by the process of present invention. The BaTiO$_3$ is epitaxial as seen by FIGS. 11 and 12.

The resultant coating of related polymer and barium and titanium metal was gradually heated from room temperature to about 1200° C. over a period of about one hour under an oxygen atmosphere. This heating process yielded polymer-free metal oxide films of BaTiO$_3$ on the substrates. The x-ray diffraction 2θ-scan of the BaTiO$_3$ film on the LaAlO$_3$ substrate is shown in FIG. 11. The film is highly oriented out of the plane and shows no detectable second phase. The epitaxy nature of the BaTiO$_3$ on LaAlO$_3$ is further evidenced by the φ-scans of (101) BaTiO$_3$ and (101) LaAlO$_3$ as shown in FIG. 12.

EXAMPLE 7

The strontium and titanium metal containing solution from Example Q was used to spin coat films onto LaAlO$_3$ substrates. Spin coating was readily achieved with a spinning speed of 1500 rpm over 30 seconds.

Figure 13:
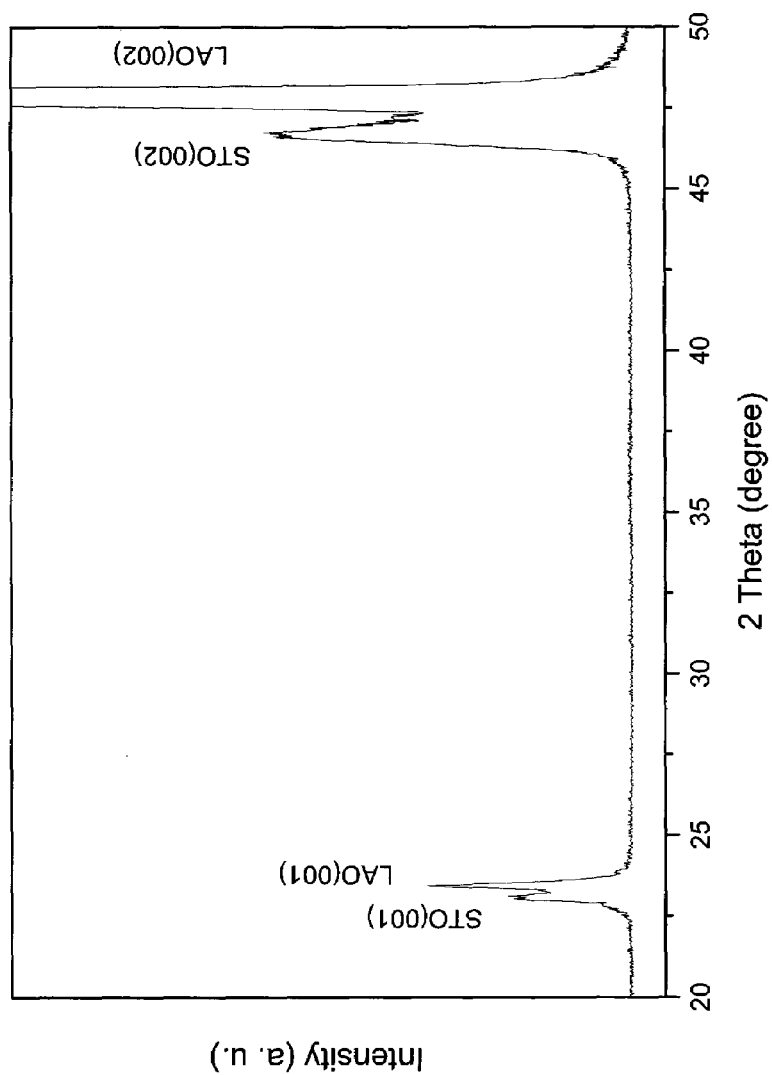
FIG. 13 shows the x-ray diffraction 2θ-scan of a SrTiO$_3$ film deposited by the process of present invention on a LaAlO$_3$ substrate. The film is highly oriented out of the plane.
Figure 14:
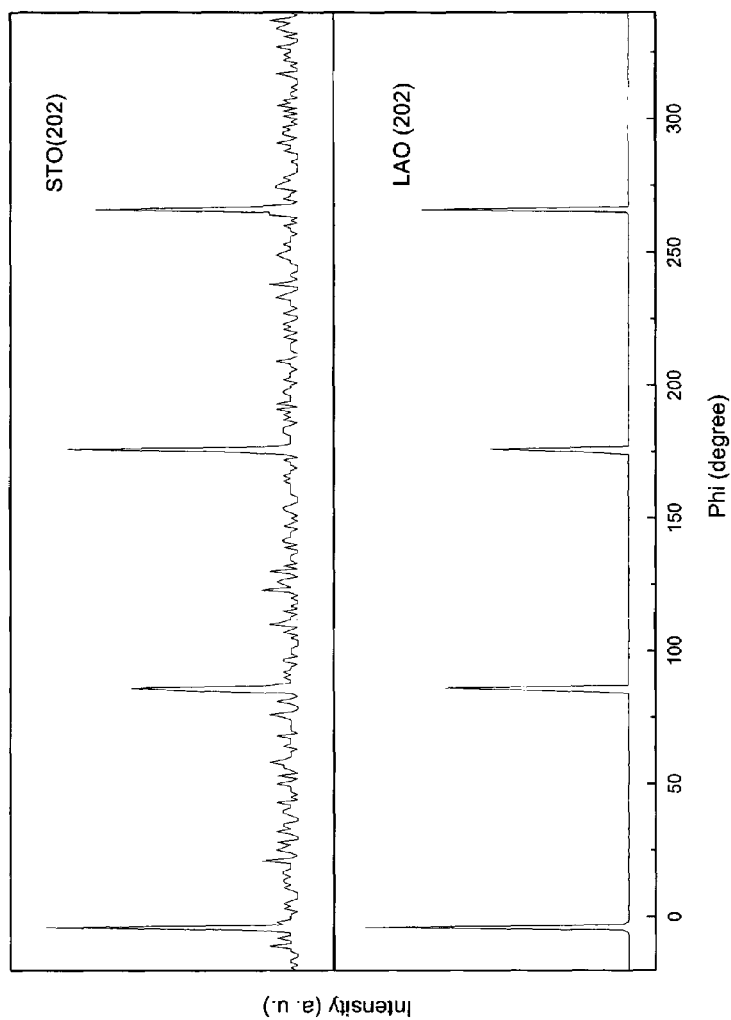
FIG. 14 shows the x-ray diffraction φ-scan of (202) SrTiO$_3$ and (202) LaAlO$_3$ substrate. The film was deposited by the process of present invention. The SrTiO$_3$ is epitaxial as seen by FIGS. 13 and 14.

The resultant coating of related polymer and strontium and titanium metal was gradually heated from room temperature to about 1200° C. over a period of about one hour under an oxygen atmosphere. This heating process yielded polymer-free metal oxide films of SrTiO$_3$ on the substrates. The x-ray diffraction 2θ-scan of the SrTiO$_3$ film on the LaAlO$_3$ substrate is shown in FIG. 13. The film is highly oriented out of the plane and shows no detectable second phase. The epitaxial nature of the SrTiO$_3$ on LaAlO$_3$ is further evidenced by the φ-scans of (202) SrTiO$_3$ and (202) LaAlO$_3$ as shown in FIG. 14.

EXAMPLE 8

An amorphous glass substrate was coated with a conducting film of indium tin oxide. A glass slide was dipped into the solution from example O. The solution coated half of the glass slide. The glass slide was then placed into a furnace and gradually heated at 10° C./minute up to 300° C., held at 300° C. for 1 hour, heated at 10° C./minute to 400° C., held at 400° C. for 30 minutes and then allowed to cool. Resistance measurements showed that the uncoated glass was non-conductive (resistance>Mohms), and the coated half had resistances as low as 20,000 Ohms.

EXAMPLE 9

A porous Anodisc membrane (aluminum oxide) was coated with zinc oxide to make the membrane more stable in a corrosive environment. An Anodisc membrane with 200 nm pores was wetted with a drop of solution from example W. The membrane was allowed to dry for two hours. The membrane was then placed into a furnace and gradually heated at 10° C./minute to 300° C., held at 300° C. for 1 hour, heated at 10° C./minute to 400° C., held at 400° C. for 30 minutes, heated at 10° C./minute to 500° C., held at 500° C. for 1 hour and then allowed to cool. Corrosion tests with concentrated hydrochloric acid showed that the zirconium oxide coated membrane was able to withstand 5 hours of concentrated hydrochloric acid with no adverse effects. An uncoated membrane breaks apart and dissolves turning the solution yellow in the same period of time. The solution with the zirconium coating showed no yellowing and the membrane retained its porosity as evidenced by the transparency when wet.

The results of these examples for films of europium oxide, zinc oxide, titanium dioxide, and mixed complex oxides such as BaTiO$_3$, SrTiO$_3$, and YBa$_2$Cu$_3$O$_{7-x}$ demonstrate that epitaxial films can be achieved using the process or technique of the present invention. This technique could therefore provide a cost effective and easy route to such complex metal oxides as YBCO used in the superconducting field as well as a wide range of applications in other areas such as doped zinc oxide and indium tin oxide films for transparent conductors, zirconium oxide as a hardening/anticorrosion layer, Eu$_2$O$_3$ as a buffer layer or as a dielectric materials, BaTiO$_3$ and SrTiO$_3$ as dielectric layer for capacitors and microwave devices. The use of metal oxides is extensive. Epitaxial growth means that the technique could be used for demanding electronic applications. The low decomposition temperature of PEI and PEIC makes such polymers desirable for glass coatings for optics/electrooptics applications. As these films can be made readily by spin coating or dip coating means that a wide variety of material types and shapes can be readily used. This may extend the range of applications to include metal oxide catalysts for catalytic converters and protective coatings for metal-based membranes.

Although the present invention has been described with reference to specific details, it is not intended that such details should be regarded as limitations upon the scope of the invention, except as and to the extent that they are included in the accompanying claims.

What is claimed is:

1. A composition of matter comprising a solution of at least two metal precursors and a soluble polymer, said polymer characterized as having binding properties for said at least two metal precursors, wherein said at least two metal precursors are present in a pre-selected ratio, said solution having been filtered so as to separate materials having molecular weights of less than 10,000 g/mol from said solution.

2. The composition of matter of claim 1 wherein said composition is a solution of said at least two metal precursors and a soluble polymer.

3. The composition of claim 1 wherein said soluble polymer is selected from the group consisting of polyethylenimine, carboxylated polyethylenimine, polyacrylic acid, polypyrolidone, and poly(ethylene-maleic acid).

4. The composition of claim 2 wherein said solution includes a solvent selected from the group consisting of water, lower alcohols, acetone, tetrahydrofuran, polyproylene carbonate, acetonitrile, ethylacetate, acetic acid, and mixtures thereof.

5. The composition of claim 4 wherein said solvent is water and is organic-solvent free.

6. The composition of claim 1 wherein said at least two metals are selected from the group consisting of alkali metals, alkaline earth metals, main group metals, transition metals, and lanthanide metals.

7. The composition of claim 1 wherein said at least two metals are selected from the group consisting of main group metals.

8. The composition of claim 1 wherein said at least two metals are selected from the group consisting of transition metals.

9. The composition of claim 1 wherein said at least two metals are selected from the group consisting of lanthanide metals.

10. The composition of claim 1 wherein said at least two metals are selected from the group consisting of alkaline earth metals.

11. The composition of claim 1 wherein said solution further includes a metal-binding ligand or salts thereof.

12. The composition of claim 11 wherein said solution further includes ethylenediaminetetraaceticacid (EDTA) or salts thereof.

13. The composition of claim 1 wherein said at least two metals are indium and tin.

14. The composition of claim 1 wherein said at least two metals are indium and titanium.

15. The composition of claim 1 wherein said at least two metals are strontium and titanium.

16. The composition of claim 1 wherein said at least two metals are yttrium, barium and copper.

17. The composition of claim 1 wherein said at least two metals are cadmium and zinc.

18. The composition of claim 1 wherein said at least two metals are gallium and zinc.

* * * * *